United States Patent
Liu et al.

(10) Patent No.: US 6,197,681 B1
(45) Date of Patent: Mar. 6, 2001

(54) FORMING COPPER INTERCONNECTS IN DIELECTRIC MATERIALS WITH LOW CONSTANT DIELECTRICS

(75) Inventors: Chih-Chien Liu, Taipei; Cheng-Yuan Tsai, Pei-Kangchen; Ming-Sheng Yang, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/477,111

(22) Filed: Dec. 31, 1999

(51) Int. Cl.[7] ................................................ H01L 21/4763
(52) U.S. Cl. .................... 438/637; 438/624; 438/627; 438/628; 438/638; 438/666; 438/687
(58) Field of Search ..................................... 438/637, 638, 438/624, 627, 628, 666, 687

(56) References Cited

U.S. PATENT DOCUMENTS

| | | | |
|---|---|---|---|
| 5,741,626 | * 4/1998 | Jain et al. ........................... | 430/314 |
| 5,821,168 | * 10/1998 | Jain ..................................... | 438/628 |
| 5,854,119 | * 12/1998 | Wu et al. ............................ | 438/396 |
| 5,877,075 | * 3/1999 | Dai et al. ............................ | 438/624 |
| 5,877,076 | * 3/1999 | Dai ..................................... | 438/624 |
| 5,880,018 | * 3/1999 | Boeck et al. ....................... | 438/700 |
| 5,882,996 | * 3/1999 | Dai ..................................... | 438/638 |
| 5,891,799 | * 4/1999 | Tsui .................................... | 438/624 |
| 5,916,823 | * 6/1999 | Lou et al. ........................... | 438/637 |
| 6,060,380 | * 5/2000 | Subramanian et al. ............. | 438/624 |
| 6,066,557 | * 5/2000 | Lukane et al. ..................... | 438/687 |
| 6,066,569 | * 5/2000 | Tobben ............................... | 438/717 |
| 6,074,942 | * 6/2000 | Lou .................................... | 438/637 |
| 6,083,822 | * 7/2000 | Lee ..................................... | 438/624 |
| 6,093,966 | * 7/2000 | Venkatraman et al. ............. | 438/687 |
| 6,100,184 | * 8/2000 | Zhao et al. ......................... | 438/638 |
| 6,103,456 | * 8/2000 | Tobben et al. ..................... | 430/317 |
| 6,107,191 | * 8/2000 | Han .................................... | 438/637 |
| 6,114,233 | * 9/2000 | Yeh ..................................... | 438/637 |

\* cited by examiner

*Primary Examiner*—John F. Niebling
*Assistant Examiner*—Lynne Gurley

(57) ABSTRACT

A method for forming the copper interconnects is disclosed. The method includes, firstly, providing a semiconductor substrate is provided. Then, a first dielectric layer is formed. Sequentially, a second dielectric layer is formed and an anti-reflective layer is formed. Then, a hardmask layer is formed. Etching of the hardmask layer is carried out. The photoresist layer is removed and another photoresist is replaced. The anti-reflective layer, the second dielectric layer and the first dielectric layer are all etched. The hardmask layer, the anti-reflective layer and the second dielectric layer are all etched. The photoresist layer, the hardmask layer and the anti-reflective layer are all removed. A first barrier layer is conformably formed on the sidewalls and the exposed surfaces of the second dielectric layer and the first dielectric layer, and on the surface of the first copper layer. A seed layer is conformably formed on the barrier layer. The via opening is filled up and the line opening with a second copper layer. Finally, the second copper layer can be planarized until the second dielectric layer is exposed.

17 Claims, 6 Drawing Sheets

6,197,681 B1

FORMING COPPER INTERCONNECTS IN DIELECTRIC MATERIALS WITH LOW CONSTANT DIELECTRICS

BACKGROUND OF THE INVENTION

1. Field of the Invention

The present invention relates to a method for forming copper interconnects in dielectric materials with low dielectric constant, and more specifically, to a method for applying dual damascene in the fabrication of a semiconductor device.

2. Description of the Prior Art

The use of copper interconnects with low-k dielectrics is actively pursued for multilevel interconnect technologies. For dual-damascene application, the first via integration scheme is not as sensitive to the lithographic alignment as the self-aligned scheme. However, the removal of photoresist residue inside the via without hurting the low-k materials will be a problem in the case of photoresist rework.

In fact, damascene is an interconnection fabrication process in which grooves are formed in an insulating layer and filled with metal to form conductive lines (metal interconnects). Dual damascene is a multi-level interconnection process in which, in addition to forming the grooves of single damascene, conductive contact (or via) openings are also formed. In the standard dual damascene process, a first oxide layer is deposited over a conductive structure. A hard mask is formed over the first oxide layer. A first patterned photoresist layer is formed on the hard mask. The hard mask is patterned using the first photoresist layer as a pattern. The first photoresist layer is removed.

A second oxide layer is then formed over the hard mask. A second patterned photoresist layer is formed over the second oxide layer. Both the first oxide layer and the second oxide layer are etched to form the dual damascene opening. The first oxide layer is etched using the hard mask as a pattern and the conductive structure as an etching stop. The second oxide layer is etched using the second photoresist layer as a pattern and the hard mask as an etching stop. The second photoresist layer is then stripped by oxygen plasma. However, the oxygen plasma damages the exposed surface of the first oxide layer and the second oxide layer within the dual damascene opening. Therefore, there is a need for an improved method for making a dual damascene contact.

Also, silicon chip technology has increased the need for multi-layer interconnect systems to provide higher density circuits, faster signal propagation and to allow direct silicon die attachment. To meet these new requirements, the dielectric material must have a low dielectric constant (preferably less than 5) to reduce signal propagation delay, and must have a thermal expansion coefficient close to the value for silicon to allow direct die attachment to the substrate.

Heretofore, most of the dielectric materials used in multi-layer circuits have been conventional thick film compositions. A typical circuit is constructed by sequentially printing, drying and firing functional thick film layers atop a ceramic substrate that is usually 92–96% wt.

The multiple steps required make this technology process intensive with the large number of process steps and yield losses attributing to high costs. Thick film technology nevertheless fills an important need in microelectronics and will continue to do so in the foreseeable future. Recently, dielectric thick film compositions with low dielectric constant have been introduced. However, ceramic substrates with thermal expansion coefficients equal to that of silicon are not readily available.

From the foregoing, it can be seen that there is a substantial need for a low temperature co-fireable tape dielectric which (1) has a low dielectric constant (less than 5), (2) has a thermal expansion coefficient very close to the value for silicon, and (3) can be fired in air at a low temperature (less than 1000° C.), thus permitting the use of high conductivity metallurgies.

Normally, the well-known low dielectrics in the semiconductor industry are made from organic materials or inorganic materials. These materials are named as low-dielectric constant materials and measured by value of k. Generally the value of k for organic materials is about 2 to 3 (k=2 to 3), and the value of k for inorganic materials is about 2 to 3.5 (k=2 to 3.5). When the chip size is much smaller due to shrinkage, the k value of the inter-metal dielectrics (IMD) or inter-layer dielectrics (ILD) in need is much lower.

Within the microelectronics industry, there is an ongoing trend toward miniaturization coupled with higher performance. The scaling of transistors toward smaller dimensions, higher speeds, and lower power has resulted in an urgent need for low constant inter-level insulators. Low dielectric constant inter-level dielectrics have already been identified as being critical to the realization of high performance integrated circuits. Thus, there exists a need in the microelectronics industry for a thermally stable, non-corrosive low dielectric constant polymer with good solvent resistance, high glass transition temperature, good mechanical performance and good adhesive properties, particularly to copper.

SUMMARY OF THE INVENTION

In accordance with the present invention, a method is provided for forming the copper interconnects in dielectric materials with low dielectric constant that can substantially employ dual-damascene in the fabrication of a semiconductor device.

In one preferred embodiment, firstly, a semiconductor substrate is provided, which has a first copper layer formed over the substrate. Then, a first dielectric layer is formed with a dielectric constant of about <3.5 over the substrate to cover at least a portion of the first copper layer. A second dielectric layer is formed with a dielectric constant of about <3.5 on the first dielectric layer. An anti-reflective layer is formed on the second dielectric layer. A hardmask layer is formed on the anti-reflective layer. A photoresist layer is formed, which has a via pattern on the hardmask layer followed by formation of the photoresist layer. Etching the hardmask layer is carried out by using the photoresist layer as an etch mask, thereby transferring the via pattern to the hardmask layer. The prepared photoresist layer is removed, then another photoresist is formed so that this another photoresist layer having a line pattern is on the via pattern. Especially the selectivity of the first dielectric layer to the second dielectric layer is large enough so that the second dielectric layer and the first dielectric layer are protected by the anti-reflective layer while the photoresist layer is being removed. The anti-reflective layer, the second dielectric layer and the first dielectric layer are all etched using the hardmask layer as an etch mask to form a via opening in the second dielectric layer and the first dielectric layer. The hardmask layer, the anti-reflective layer and the second dielectric layer are all etched using the photoresist layer as an etch mask to form a line opening in the second dielectric layer and the first dielectric layer. The photoresist layer, the hardmask layer and the anti-reflective layer are all removed. A first barrier layer is conformably formed on the sidewalls and the exposed surfaces of the second dielectric layer and the first dielectric layer, and on the surface of the first copper layer. A seed layer is conformably formed on the barrier layer. The via opening is filled up and the line opening with a second copper layer. Finally, the second copper layer can be planarized until the second dielectric layer is exposed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a preferred embodiment directed to interconnections, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding figures. It will briefly be noted here that substrate in FIGS. 1A to 1M.

Figure 1A:
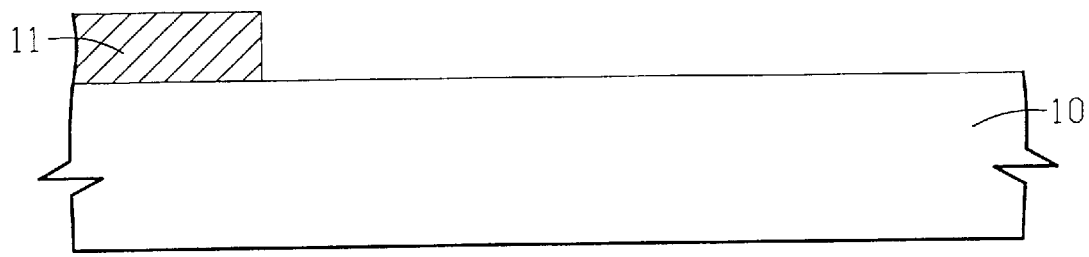
FIGS. 1A to 1M are illustrative of various components in the cross section structure of the embodiment of the present invention.

With reference to FIG. 1A, first of all, semiconductor substrate 10 is provided, which has dielectric layer 11 and first copper layer 12 (shown in FIG. 1B) formed over substrate 10.

Figure 1B:
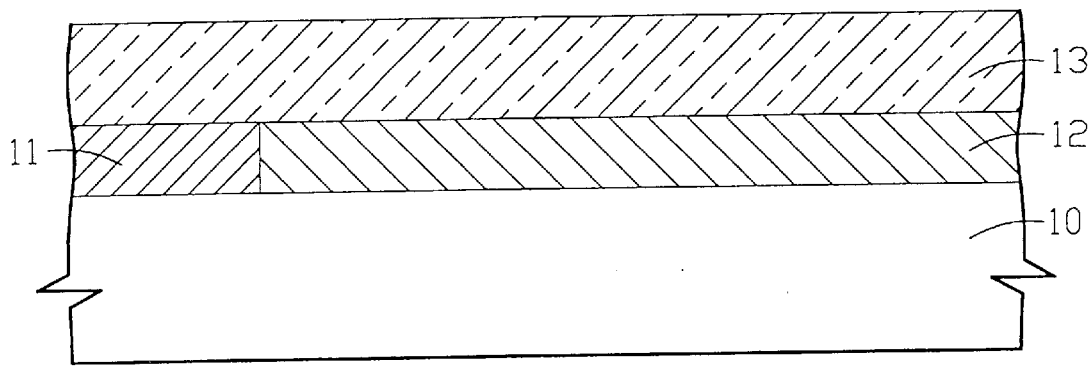

Then, as shown in FIG. 1B, first dielectric layer 13 is formed with dielectric constant of about <3.5 over substrate 10 to cover at least a portion of first copper layer 12.

Figure 1C:
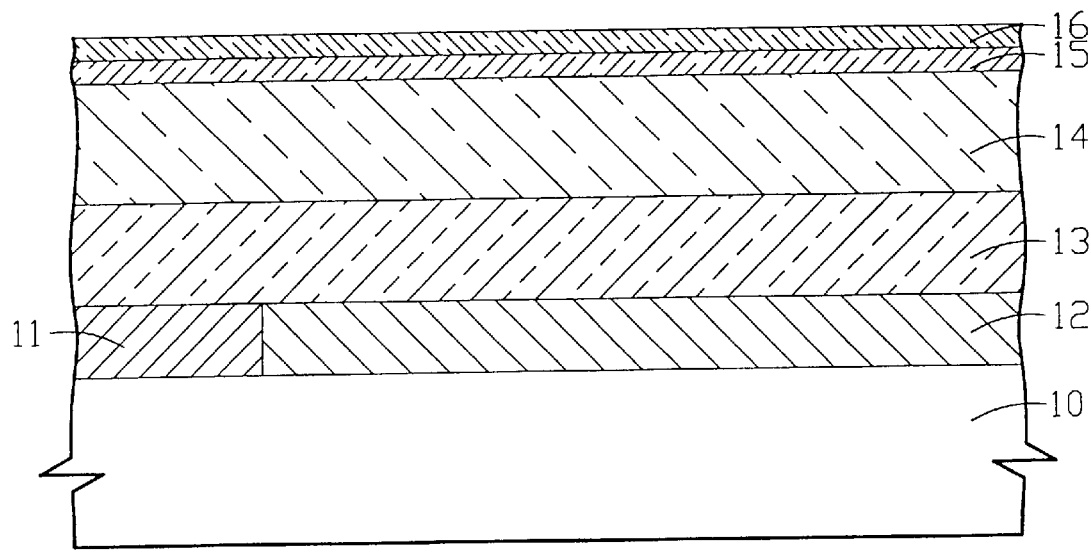

As shown in FIG. 1C, second dielectric layer 14 is formed with a dielectric constant of about <3.5 on first dielectric layer 13. The selectivity of the first dielectric layer to the second dielectric layer is about <3.5. The anti-reflective layer 15, composed of titanium nitride, is formed on second dielectric layer 14. Hardmask layer 16, silicon nitride is formed on anti-reflective layer 15.

Figure 1D:
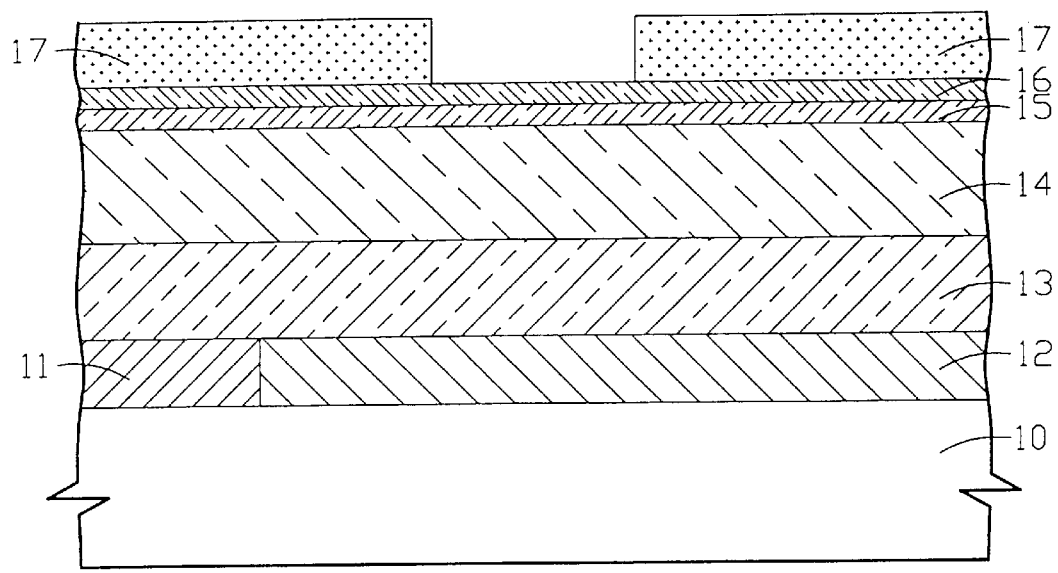

As shown in FIG. 1D, photoresist layer 17 is formed, which owns a via pattern on hardmask layer 16 followed by developing photoresist layer 17.

Figure 1E:
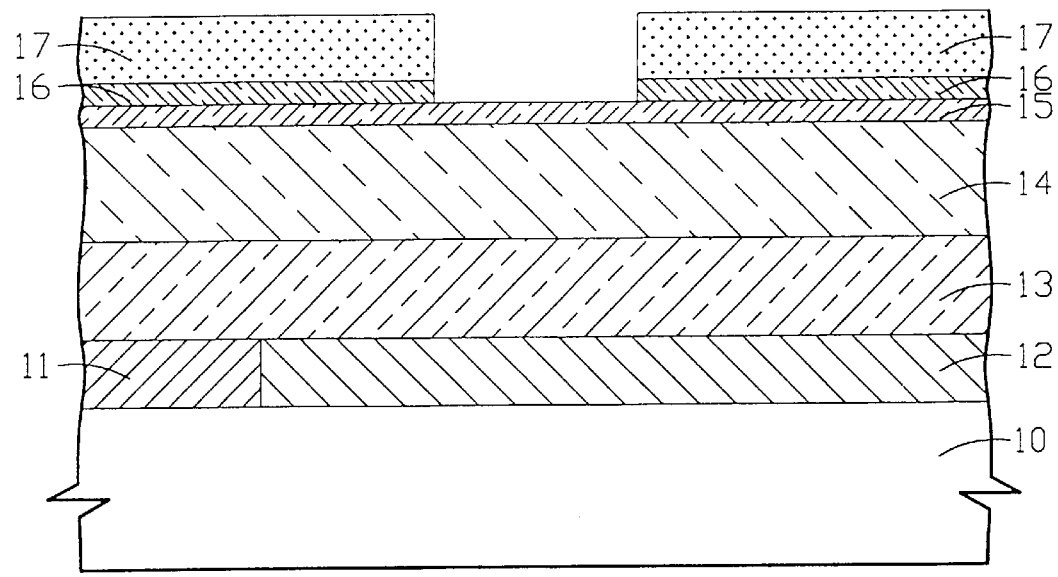

As shown in FIG. 1E, etching hardmask layer 16 is carried out by using developed photoresist layer 17 as an etch mask, thereby transferring the via pattern to hardmask layer 16.

Figure 1F:
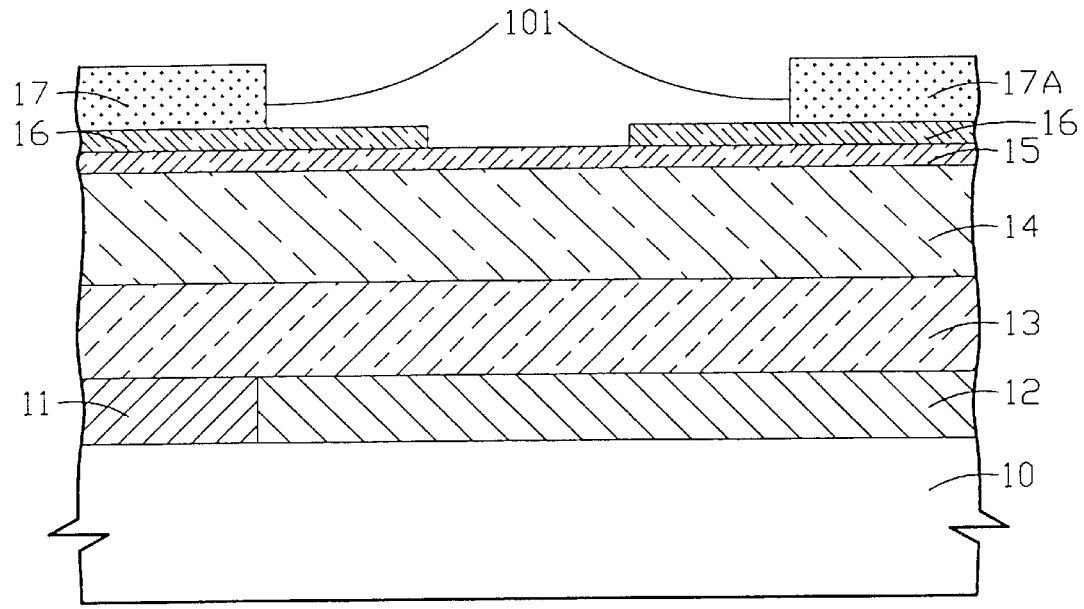

Then, as shown in FIG. 1F, developed photoresist layer 17 is removed and another photoresist is formed as photoresist 17A so that photoresist layer 17A which is a treated photoresist possesses a line pattern on the via pattern. When the photolithography alignment operates, the original photoresist should be removed and a new photoresist is provided. At this moment, the anti-reflective layer can protect the low-k dielectric layer and the low-k dielectric layer will not be damaged at this stage. Also, photoresist layer 17A possesses a second (line) pattern having a dimension larger than the first (via) pattern. Especially the selectivity of first dielectric layer 13 to second dielectric layer 14 is large enough, so that second dielectric layer 14 and first dielectric layer 13 are protected by anti-reflective layer 15 while photoresist layer 17 is being treated.

Figure 1G:
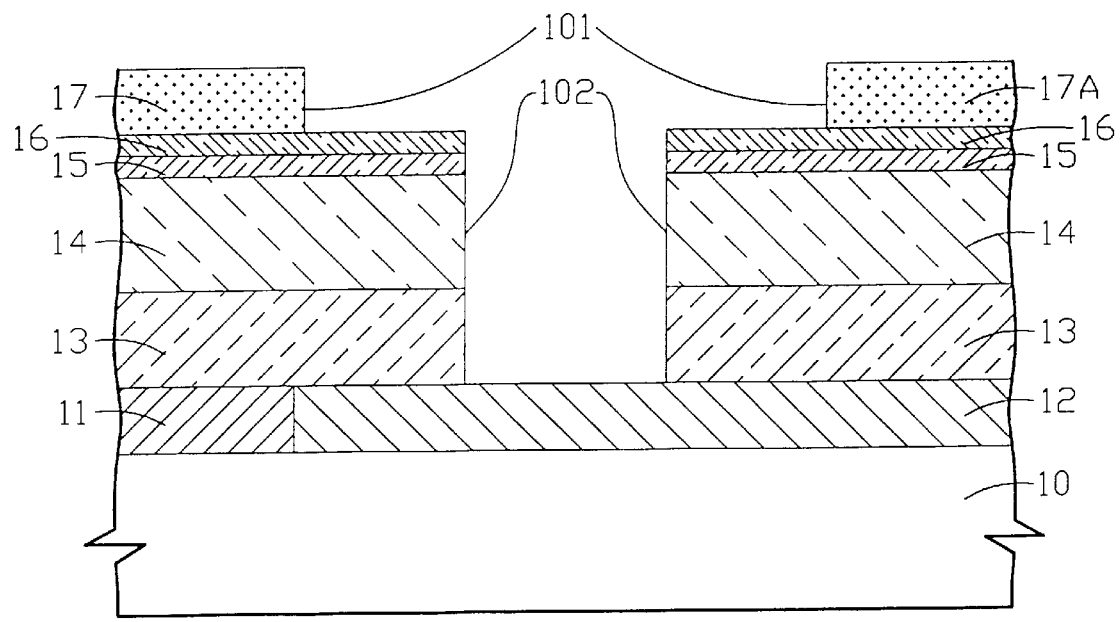

FIG. 1G shows that anti-reflective layer 15, second dielectric layer 14 and first dielectric layer 13 are all etched by using hardmask layer 16 as an etch mask to form a via opening 102 in second dielectric layer 14 and first dielectric layer 13. Also, hardmask layer 16, anti-reflective layer 15 and second dielectric layer 14 are all etched by using treated photoresist layer 17A as an etch mask to form a line opening 101 in second dielectric layer 14 and first dielectric layer 13.

Figure 1H:
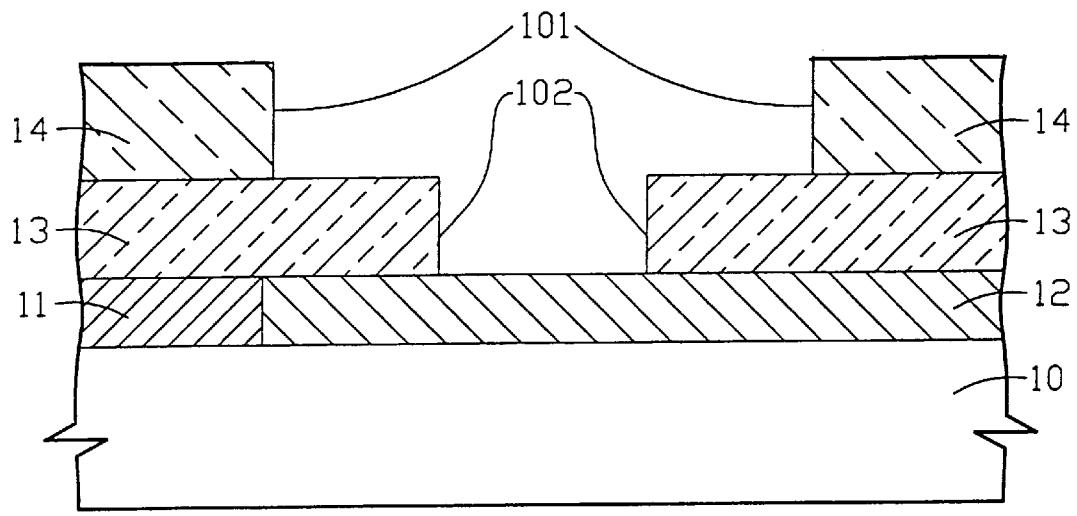

As shown in FIG. 1H, treated photoresist layer 17A, hardmask layer 16 and anti-reflective layer 15 are all removed by conventional etching.

Figure 1I:
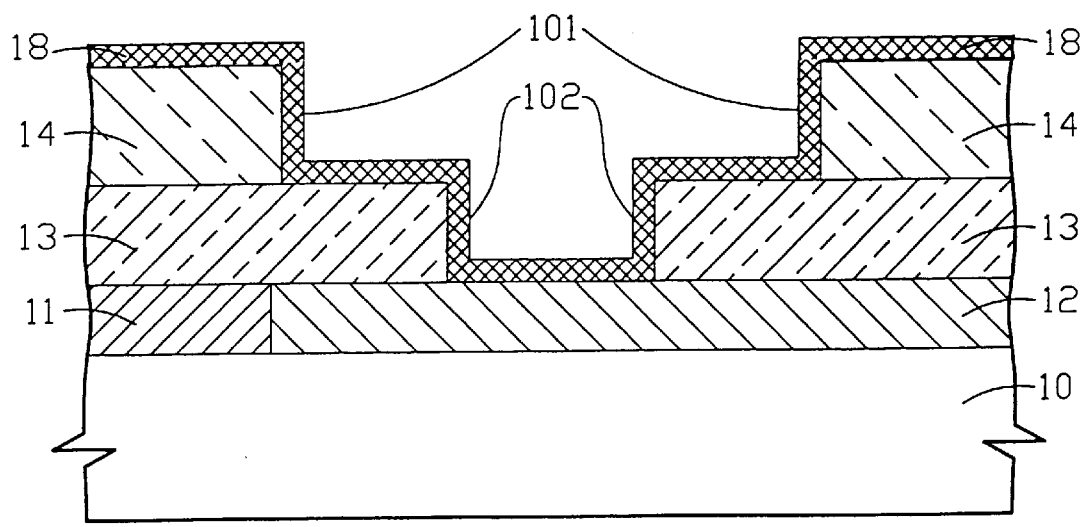

Next, as FIG. 1I, first barrier layer 18, composed of tantalum nitride, is conformably formed on the sidewalls and the exposed surfaces of second dielectric layer 14 and first dielectric layer 13, and on the surface of first copper layer 12.

Figure 1J:
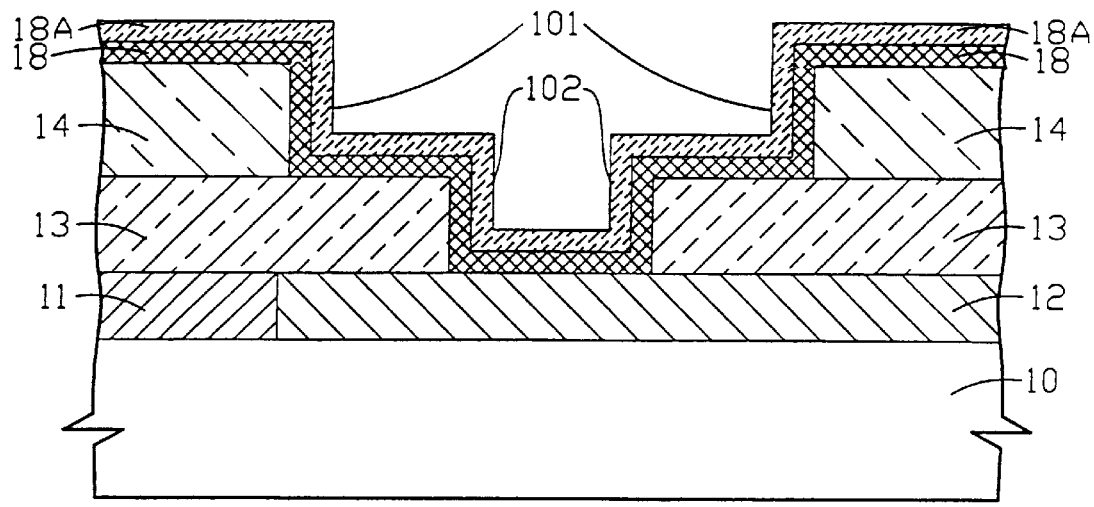

FIG. 1J shows that seed layer 18A is conformably formed on first barrier layer 18. Here, seed layer 18A is a kind of copper metal.

Figure 1K:
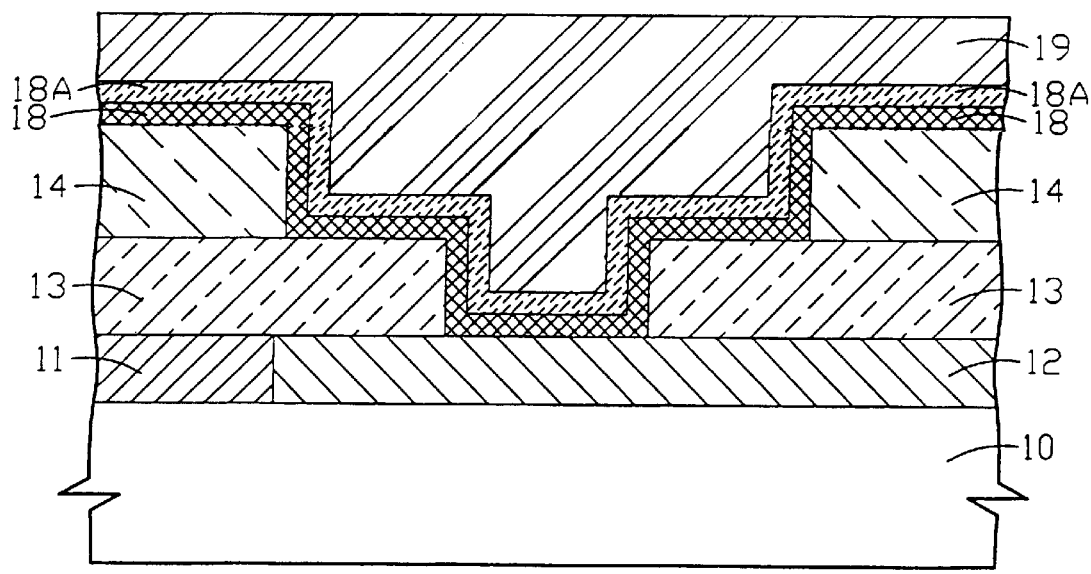

Then, as FIG. 1K, via opening 102 and line opening 101 are all filled up with second copper layer 19 using conventional deposition.

Figure 1L:
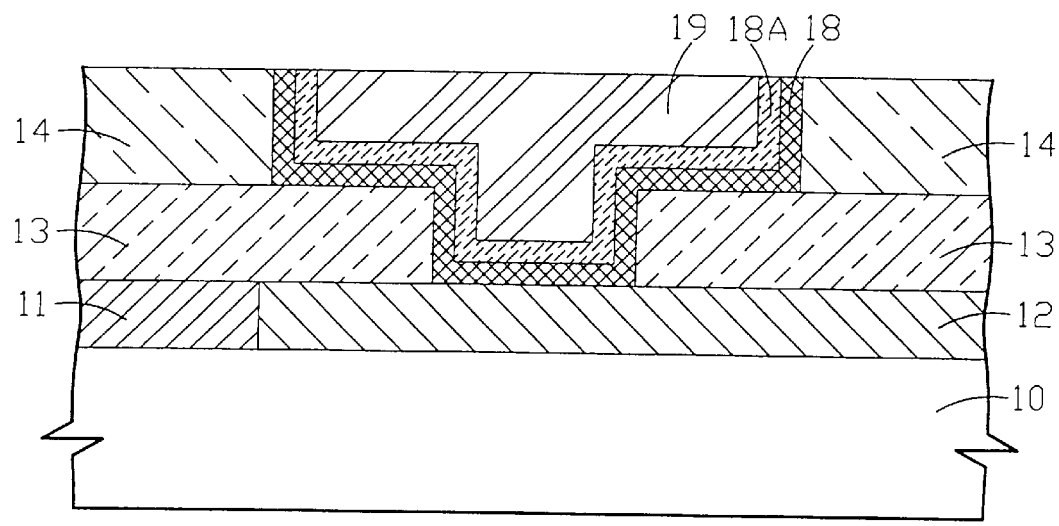

Sequentially, as shown in FIG. 1L, second copper layer 19 can be planarized using chemical mechanical polishing until second dielectric layer 14 is exposed.

Figure 1M:
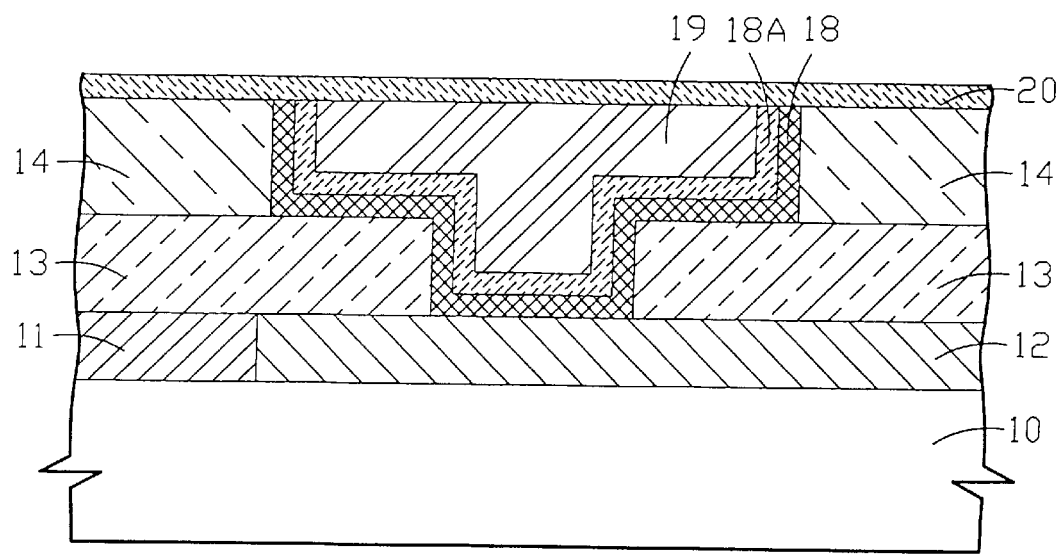

Finally, as shown in FIG. 1M, second barrier layer 20 such as copper barrier 20 can be deposited on the surface of the planarized second copper layer 19 and second dielectric layer 14 using conventional deposition.

The object of this invention can protect dielectrics that are made from low-k materials by above photoresist mask 17. The hard mask and the anti-reflection layer all can be deposited on top of the dual damascene structure in the beginning of process. Also, reformed photoresist mask 17 is one of the main reasons for solving the above problem. In addition, if via dielectrics and line dielectrics that are all low dielectric constant materials possess enough etching selectivity, the arc layer can be one of the dual cap layer on top surface in order to reduce the total capacitance.

Therefore, it can be briefly described as the following according to this present invention which is a process of forming copper interconnects in dielectric material with low dielectric constant for dual-damascene application. First, a semiconductor substrate is provided, which has a first copper layer formed over the substrate. Then, a first dielectric layer is formed with a dielectric constant of about <3.5 over the substrate to cover at least a portion of the first copper layer. A second dielectric layer is formed with a dielectric constant of about <3.5 on the first dielectric layer. An anti-reflective layer is formed on the second dielectric layer. A hardmask layer is formed on the anti-reflective layer. A photoresist layer is formed, which has a via pattern on the hardmask layer followed by developing the photoresist layer.

Etching the hardmask layer is carried out by using the photoresist layer as an etch mask, thereby transferring the via pattern to the hardmask layer. The photoresist layer is removed, then another photoresist is formed so that this another photoresist layer possesses a line pattern on the via pattern. The the selectivity of the first dielectric layer to the second dielectric layer is large enough so that the second dielectric layer and the first dielectric layer is protected by the anti-reflective layer while the photoresist layer is being removed. The anti-reflective layer, the second dielectric layer and the first dielectric layer are all etched by using the hardmask layer as an etch mask to form a via opening in the second dielectric layer and the first dielectric layer. The hardmask layer, the anti-reflective layer and the second dielectric layer are all etched by using the photoresist layer as an etch mask to form a line opening in second dielectric layer and the first dielectric layer. The photoresist layer, the hardmask layer and the anti-reflective layer are all removed. A first barrier layer is conformably formed on the sidewalls and the exposed surfaces of the second dielectric layer and the first dielectric layer, and on the surface of the first copper layer. A seed layer is conformably formed on the barrier layer. The via opening is filled up and the line opening with a second copper layer. Finally, the second copper layer can be planarized until the second dielectric layer is exposed.

Although specific embodiments have been illustrated and described, it will be obvious to those skilled in the art that various modifications may be made without departing from what is intended to be limited solely by the appended claims.

What is claimed is:

1. A metallization process, comprising:

providing a semiconductor substrate having a first conductive layer formed over the substrate;

forming a first dielectric layer over the substrate to cover at least a portion of said first conductive layer;

forming a second dielectric layer on said first dielectric layer;

forming an anti-reflective layer on said second dielectric layer;

forming a hardmask layer on said anti-reflective layer;

forming a first photoresist layer having a first pattern on said hardmask layer followed by developing said first photoresist layer;

etching said hardmask layer by using the developed first photoresist layer as an etch mask, thereby transferring the first pattern to said hardmask layer;

removing said first photoresist layer;

forming a second photoresist so that said second photoresist layer possesses a second pattern having a dimension larger than the first pattern, and on the first pattern, wherein said second dielectric layer and said first dielectric layer is protected by said anti-reflective layer while said first photoresist layer is being removed;

etching said anti-reflective layer, said second dielectric layer and said first dielectric layer by using said hardmask layer as an etch mask;

etching said hardmask layer, said anti-reflective layer and said second dielectric layer by using said second photoresist layer as an etch mask, therefore contact openings are formed in said first dielectric layer and said second dielectric layer, and the surface of said first conductive layer is exposed;

removing the second photoresist layer, said hardmask layer and said anti-reflective layer;

conformably forming a first barrier layer on the sidewalls and the exposed surfaces of said second dielectric layer and said first dielectric layer, and on the surface of said first conductive layer;

conformably forming a seed layer on said barrier layer;

filling the contact openings with a second conductive layer; and planarizing said second conductive layer until said second dielectric layer is exposed.

2. The process according to claim 1, wherein said first dielectric layer comprises dielectric constant of about <3.5.

3. The process according to claim 2, wherein said second dielectric layer comprises dielectric constant of about <3.5.

4. The process according to claim 3, wherein the selectivity of said first dielectric layer to said second dielectric layer is about <3.5.

5. The process according to claim 1, wherein said anti-reflective layer comprises titanium nitride.

6. The process according to claim 1, wherein said hardmask layer comprises silicon nitride.

7. The process according to claim 1, wherein said barrier layer comprises tantalum nitride.

8. The process according to claim 1, wherein said seed layer comprises copper.

9. The process according to claim 1, wherein said first conductive layer and said second conductive layer comprise copper.

10. The process according to claim 1, further comprising forming a second barrier layer on the surface of said planarized second conductive layer and said second dielectric layer.

11. A process of forming copper interconnects in dielectric material with low dielectric constant for dual-damascene application, comprising:

providing a semiconductor substrate having a first copper layer formed over the substrate;

forming a first dielectric layer with dielectric constant of about <3.5 over the substrate to cover at least a portion of said first copper layer;

forming a second dielectric layer with dielectric constant of about <3.5 on said first dielectric layer;

forming an anti-reflective layer on said second dielectric layer;

forming a hardmask layer on said anti-reflective layer;

forming a first photoresist layer having a via pattern on said hardmask layer followed by developing said first photoresist layer;

etching said hardmask layer by using said first photoresist layer as an etch mask, thereby transferring the via pattern to said hardmask layer;

removing said first photoresist layer;

forming a second photoresist so that said second photoresist layer possesses a line pattern on the via pattern, wherein the selectivity of said first dielectric layer to said second dielectric layer is large enough so that said second dielectric layer and said first dielectric layer is protected by said anti-reflective layer while said first photoresist layer is being removed;

etching said anti-reflective layer, said second dielectric layer and said first dielectric layer by using said hardmask layer as an etch mask to form a via opening in said second dielectric layer and said first dielectric layer;

etching said hardmask layer, said anti-reflective layer and said second dielectric layer by using said second photoresist layer as an etch mask to form a line opening in second dielectric layer and said first dielectric layer;

removing said second photoresist layer, said hardmask layer and said anti-reflective layer;

conformably forming a first barrier layer on the sidewalls and the exposed surfaces of said second dielectric layer and said first dielectric layer, and on the surface of said first copper layer;

conformably forming a seed layer on said barrier layer;

filling the via opening and the lien opening with a second copper layer; and palnarizing said second copper layer until said second dielectric layer is exposed.

12. The process according to claim 11, wherein the selectivity of said first dielectric layer to said second dielectric layer is about <3.5.

13. The process according to claim 11, wherein said anti-reflective layer comprises titanium nitride.

14. The process according to claim 11, wherein said hardmask layer comprises silicon nitride.

15. The process according to claim 11, wherein said barrier layer comprises tantalum nitride.

16. The process according to claim 11, wherein said seed layer comprises copper.

17. The process according to claim 11, further comprising forming a second barrier layer on the surface of said planarized second copper layer and said second dielectric layer.

* * * * *